United States Patent
Howell

[11] Patent Number: 6,131,793
[45] Date of Patent: Oct. 17, 2000

[54] REFLOW SOLDERING APPARATUS

[75] Inventor: David A. Howell, Boise, Id.

[73] Assignee: MCMS, Inc., Nampa, Id.

[21] Appl. No.: 09/049,439

[22] Filed: Mar. 27, 1998

[51] Int. Cl.[7] .................................................. B23K 37/04
[52] U.S. Cl. ........................... 228/9; 228/44.7; 228/102; 269/903
[58] Field of Search .................................. 228/8, 9, 44.7, 228/49.5, 102; 269/903

[56] References Cited

U.S. PATENT DOCUMENTS

| | | |
|---|---|---|
| 2,788,430 | 4/1957 | Oakley . |
| 3,064,715 | 11/1962 | Bland . |
| 3,610,508 | 10/1971 | Laubmeyer . |
| 3,893,613 | 7/1975 | Une et al. . |
| 3,941,293 | 3/1976 | Chartet . |
| 4,102,481 | 7/1978 | Ollenbach . |
| 4,677,937 | 7/1987 | Tee . |
| 4,706,796 | 11/1987 | Chambers ............................ 198/346.1 |
| 4,720,035 | 1/1988 | Isogai . |
| 4,909,429 | 3/1990 | Ankrom et al. . |
| 5,307,977 | 5/1994 | Park . |
| 5,377,897 | 1/1995 | Zimmer . |
| 5,885,353 | 3/1999 | Strodtbeck et al. ..................... 118/712 |

Primary Examiner—Samuel M. Heinrich
Attorney, Agent, or Firm—Dorsey & Whitney LLP

[57] ABSTRACT

With the present invention, a circuit card assembly having a nonvertically approaching device may be manufactured with reflow soldering. The circuit card assembly includes a circuit card and a nonvertically approaching device such as an edge connector, which is soldered to the circuit card with reflowed solder. The device is soldered to the circuit card by initially heating the circuit card, along with included reflow solder, prior to mating the device to the circuit card. Once the solder has melted and while it is in a liquidus state, the device is mated with the circuit card. In this manner, the nonvertically approaching leads of the device slide into the solder as they are positioned onto their circuit card soldering surfaces. Once cooled, the solder solidifies to conductively mount the device to the circuit card.

A mating pallet is provided for soldering a device having nonvertically approaching leads to a circuit card. In one embodiment, the mating pallet comprises a holder assembly and a trigger assembly. The holder assembly holds the device in an oven while the nonliquidus solder is heated for reflow.

The trigger assembly is in communication with the holder assembly in order to trigger it to mate the device with the circuit card while the solder is liquidus.

18 Claims, 15 Drawing Sheets

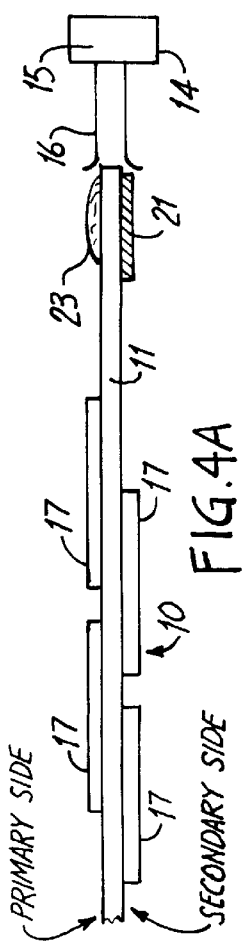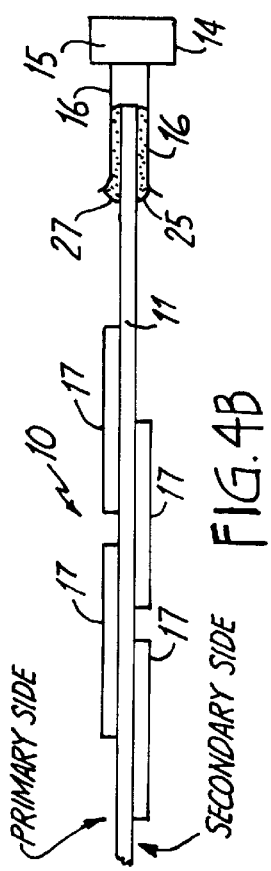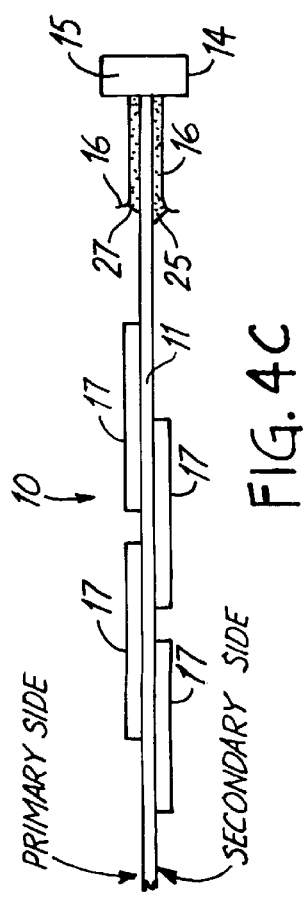

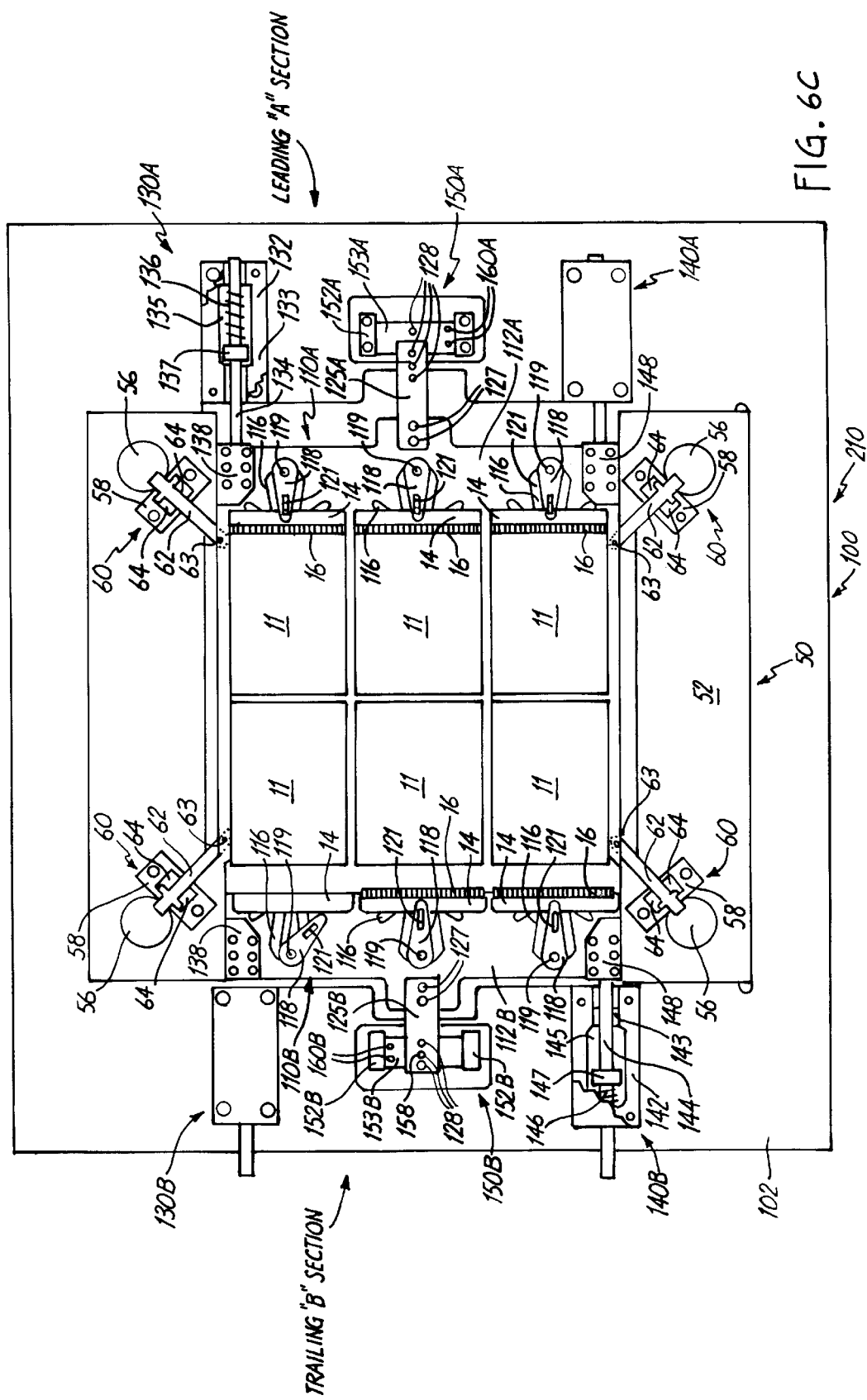

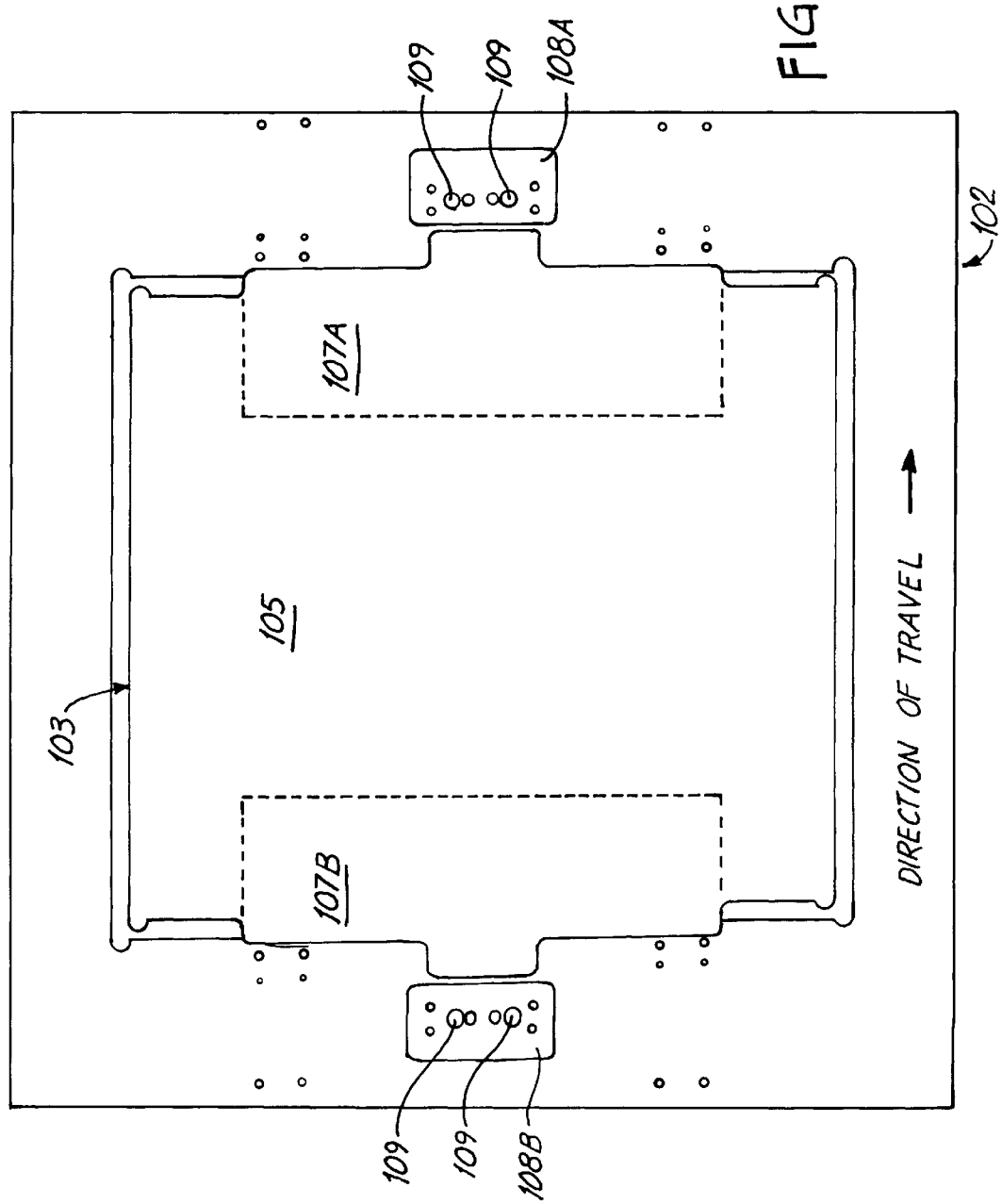

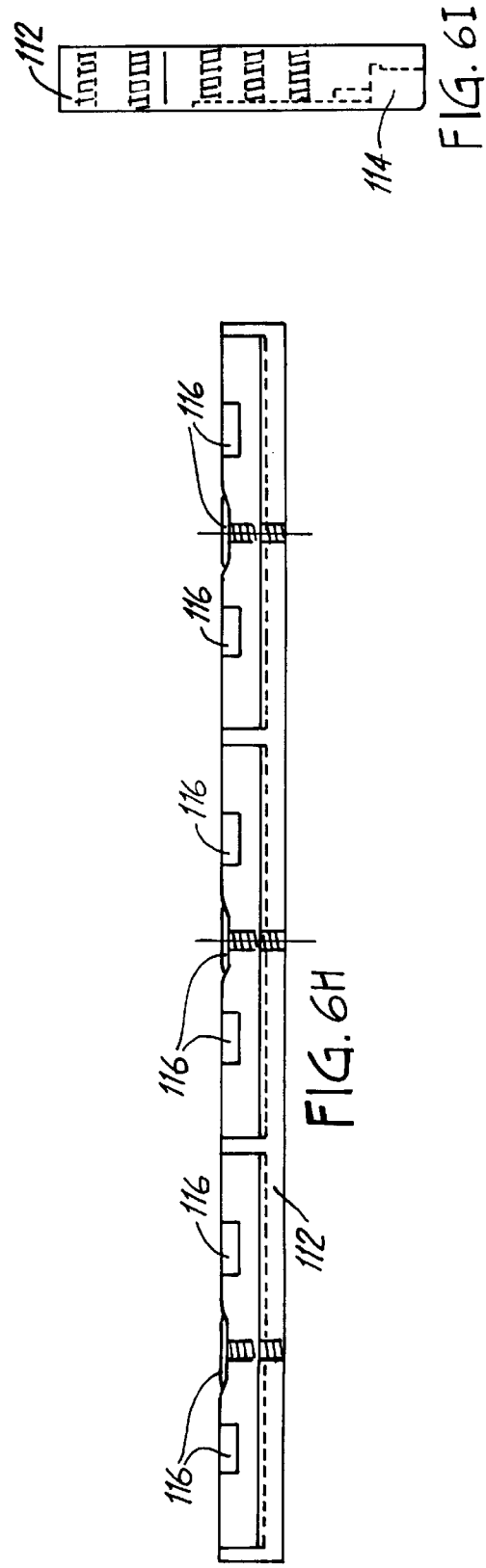
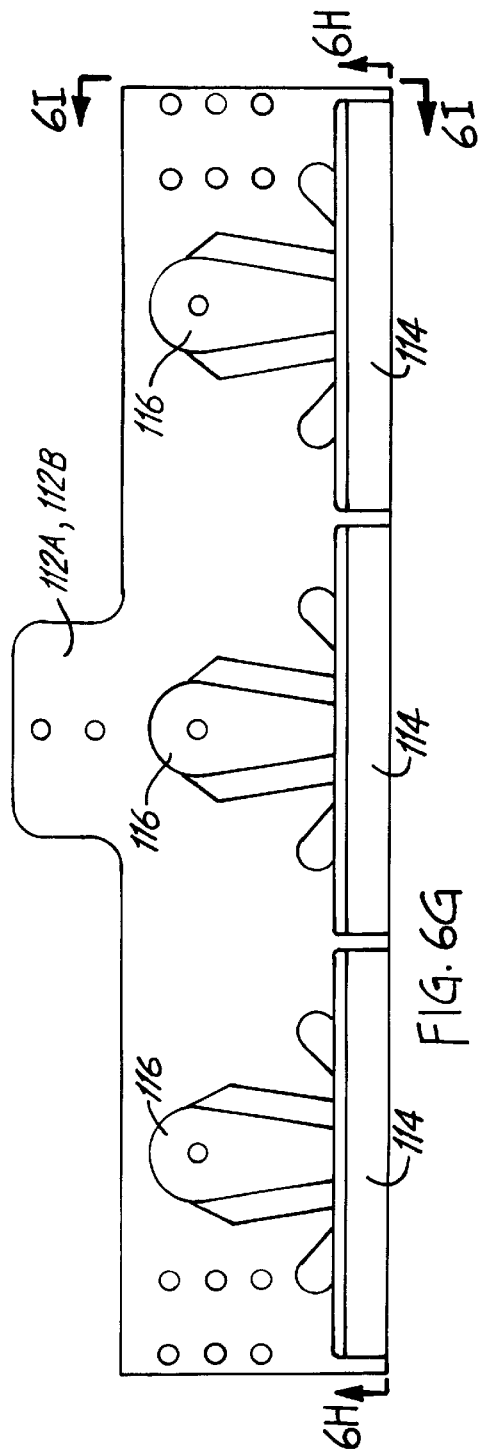

REFLOW SOLDERING APPARATUS

This application is related to and hereby incorporates by reference an application titled A REFLOW SOLDERING METHOD, filed on the same date herewith.

1. TECHNICAL FIELD

The present invention relates generally to a soldering reflow method. In particular, the present invention relates to reflow soldering processes for soldering certain leaded devices to soldering surfaces.

2. BACKGROUND

Reflow soldering is a form of soldering that enables reflowable (e.g., surface mounted) components to be efficiently and effectively mounted to one or both side(s) of a circuit card. The term "circuit card" generally describes any substrate, with or without a component, for accommodating a circuit. A circuit card would include but is not limited to a printed circuit board ("PCB"), a printed circuit assembly ("PCA"), and a bread board. FIGS. 1A to 1C depict a circuit card assembly 10 having a circuit card 11, an edge connector 14, and reflowable components 17.

The reflowable components 17 are soldered to component pads 12 (FIG. 1C) of circuit card 11. Typically, solder paste is screenprinted onto the component pads 12; components 17 are then placed onto their corresponding pads atop the solder paste. After this placement, the entire card (including components 17) are heated in an oven to reflow the solder, i.e., to melt and separate the solder from the solder paste so as to create both a mechanical and electrical connection between components and their component pads after the reflowed solder has cooled and solidified.

Reflow soldering is well-suited for the at least partially automated manufacture of printed circuit assemblies. Reflowable components, which can be placed essentially vertically onto screenprinted solder paste, pierce the solder paste deposit without displacing it from the pad on which it is deposited. When reflow heating occurs, both the component leads and the solder paste are properly positioned. Unfortunately, it has not been practical to mount certain other nonvertically approaching components such as edge connectors onto the circuit card with reflow soldering methods.

With reference to FIGS. 1A and 1B, edge connector 14 has a connector body 15 and nonvertically approaching leads 16. FIG. 1A shows connector 14 prior to being mated with the circuit card 11. Conversely, FIG. 1B shows connector 14 after it has been mated with the circuit card 11.

Edge connector 14 is a "nonvertically approaching device" because it has nonvertically approaching leads 16. A "nonvertically approaching lead" is a lead that when being positioned onto a pad for soldering is not amenable to being placed onto the pad in a vertical fashion. For example, an edge connector 14 (as depicted in FIGS. 1A and 1B) normally has two closely spaced rows of connector leads 16 that are designed to straddle an edge of the circuit card 11 and conductively contact connector pads 13, which are located at the edge of the circuit card. Based on the geometrical configuration of the connector with respect to its nonvertically approaching leads 16, it is typically not viable to mate the connector 14 with the circuit card 11 so that the leads 16 encounter the solder paste with a vertical approach; rather, the leads 16 approach horizontally, somewhat parallel to the plane of the connector pads 13 and move across the connector pads at or very close to the connector pad surfaces.

Thus, as is depicted in FIGS. 2A and 2B, when a nonvertically approaching device such as edge connector 14 is mated to a circuit card after solder paste 21 has been applied to its pads in preparation for reflow, its nonvertically approaching leads 16 tend to "scrape" or displace the solder paste off of the pads before reflow. When reflow occurs, the solder joints are often unsatisfactory due possibly to shorting between pads, insufficient solder at the lead and pad interface, or solder balling.

In addition, as shown in FIGS. 2C to 2E, a further problem may arise. In some automated processes (e.g., with a circuit card having components on both sides), the solder paste deposited on a primary side is reflowed before solder paste is spread onto the secondary side. This means that solder paste spread on primary side connector pads will reflow, cool, and solidify atop the primary side connector pads before solder paste is spread onto the secondary side connector pads and thus, before the edge connector 14 is mated with the circuit card 11. Now, when the edge connector is mated to the circuit card prior to reflow heating, not only is solder paste 21 scraped off of the secondary connector pads by the horizontal approach of the leads 16, but also, the primary side solder domes 23 cause the primary side leads of the edge connector 14 to deflect away from their target connector pads. When reflow occurs, the resulting solder bonds on both the primary and secondary sides are often unsatisfactory.

To avoid such problems, nonvertically approaching devices have been manually soldered to circuit cards after the reflowable components have been mounted. During the solder paste deposit phase, solder paste is not applied to the pads corresponding to the nonvertically approaching devices. Once the reflowable components have been reflowed, a human operator manually mates the nonvertically approaching device with the circuit card. Solder is then "dragged" across each nonvertically approaching lead with a soldering iron that may have a special finepoint tip. It can be seen, however, that this method is tedious and time consuming for the human operator. Moreover, such manual soldering can lead to poor solder connections resulting from human error, as well as from inherent flaws in the soldering method. For example, cold solder connections can occur due to heat being drawn away from the soldering surface by the surrounding structure (e.g., connector, circuit card, work surface), which are at room temperature. In addition, the dragging of solder across a lead may merely "blanket" the lead without sufficiently "wetting" (i.e., bonding of the solder to the component lead and component pad surfaces).

Accordingly, what is needed in the art is a solution for operably mounting a nonvertically approaching device such as an edge connector onto a soldering surface with a reflow soldering method.

3. SUMMARY OF THE INVENTION

With the present invention, a circuit card assembly having a nonvertically approaching device may be manufactured with reflow soldering. The circuit card assembly includes a circuit card and a nonvertically approaching device such as an edge connector, which is soldered to the circuit card during the reflow process. The device is soldered to the circuit card by initially heating the circuit card, along with included reflow solder, prior to mating the device to the circuit card. Once the solder has melted and while it is in a liquidus phase, the device is mated with the circuit card. In this manner, the nonvertically approaching leads of the device slide into the liquidus solder and are positioned onto their respective circuit card soldering surfaces. Once cooled, the solder solidifies to provide both a mechanical and electrical connection between the device and the circuit card.

A mating pallet is provided for soldering a device having nonvertically approaching leads to a circuit card. In one embodiment, the mating pallet comprises a holder assembly and a trigger assembly. The holder assembly holds the device in an oven while the solder is heated for reflow. The trigger assembly is in communication with the holder assembly in order to trigger it to mate the device with the circuit card while the solder is in a liquidus phase.

4. BRIEF DESCRIPTION OF THE DRAWINGS

FIG. 4A is a profile view of an embodiment of a circuit card assembly of the present invention showing a circuit card's connector pads with solder paste on the secondary surface and solid, previously reflowed solder prior to mating on the primary side with an edge connector.

FIG. 4B is a profile view of the circuit card assembly of FIG. 4A at a liquidus phase with the edge connector partially mated with the circuit card.

FIG. 4C is a profile view of the circuit card assembly of FIGS. 4A and 4B with the edge connector mated with the circuit card.

FIG. 6C shows a top functional view of the mating pallet of FIG. 6A including a tray assembly.

FIG. 6E depicts a top view of the pallet housing for the mating pallet of FIGS. 6A and 6C.

FIG. 6G is a top view of a holder body from the mating pallet of FIGS. 6A and 6C.

FIG. 6H is a cross-sectional view taken along a plane passing through line 6H—6H of FIG. 6G.

FIG. 6I is a cross-sectional view taken along a plane passing through line 6I—6I of FIG. 6G.

5. DETAILED DESCRIPTION 5.1 Overview

With the present invention, a nonvertically approaching device may be mounted to a soldering surface with reflow soldering. In one embodiment, the circuit card (including the pads for the nonvertically approaching leads and the included solder) are sufficiently heated in an oven prior to mating the device to the circuit card. While the solder is in a liquidus phase, the device is mated with the circuit card, thereby causing the nonvertically approaching leads to slide into liquidus solder as they are positioned onto the pads. After cooling, the solder solidifies to provide both a mechanical and electrical connection between the leads and pads.

Figure 1A:
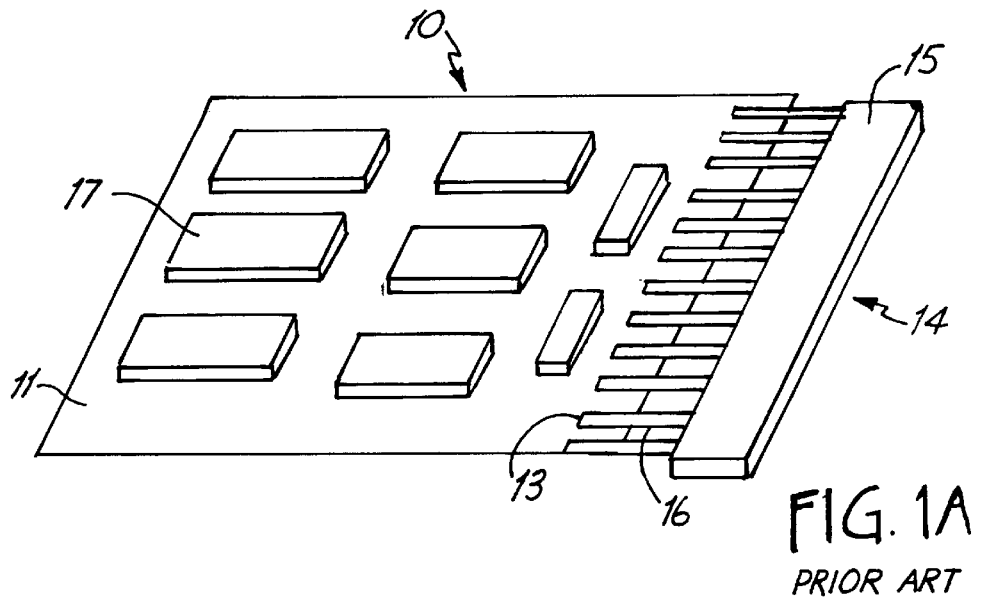
FIG. 1A is a prior art depiction of a circuit card with an unmated edge connector.
Figure 1B:
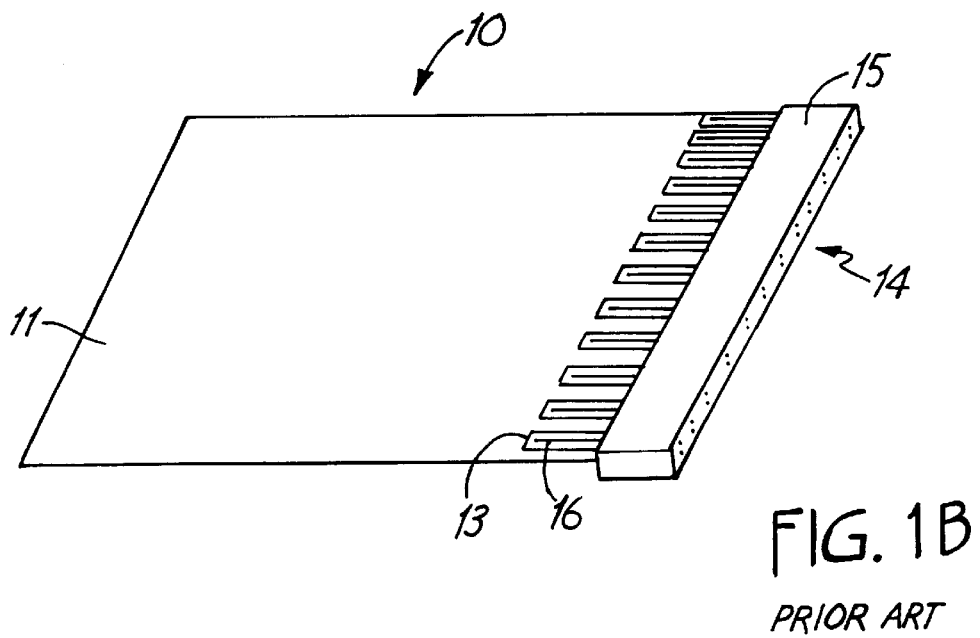
FIG. 1B is a prior art depiction of a circuit card with a mated, unsoldered edge connector.
Figure 1C:
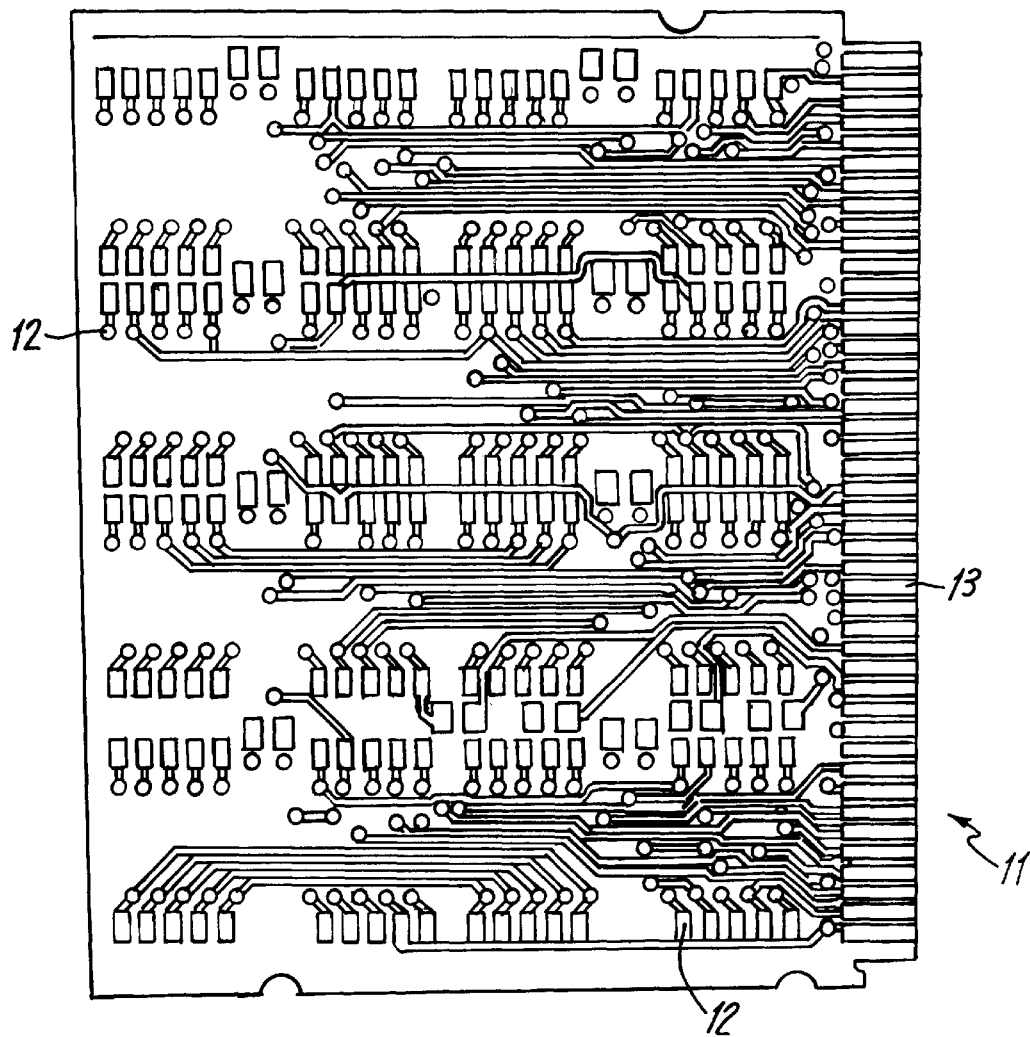
FIG. 1C is a top view of a prior art circuit card.
Figure 2A:
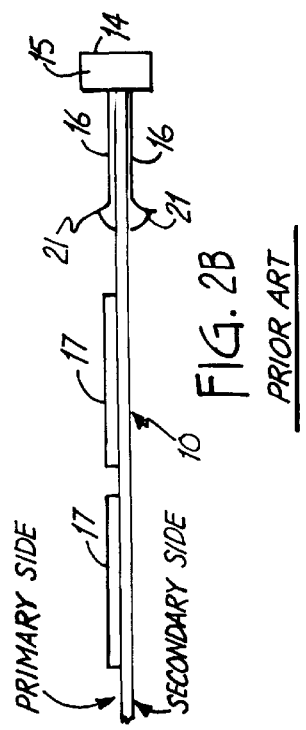
FIG. 2A is a prior art profile view showing a circuit card's connector pads with solder paste prior to mating with an edge connector.
Figure 2B:
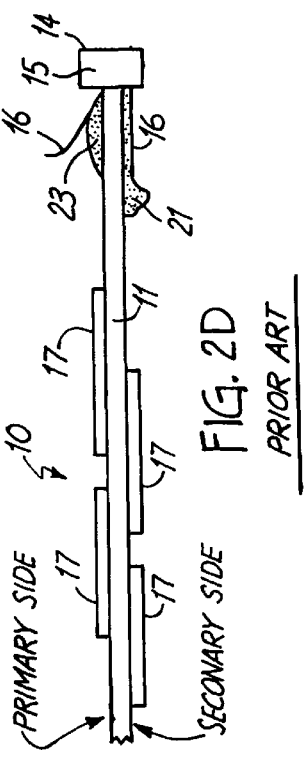
FIG. 2B is a prior art profile view of the circuit card of FIG. 2A after mating with the edge connector.
Figure 2C:
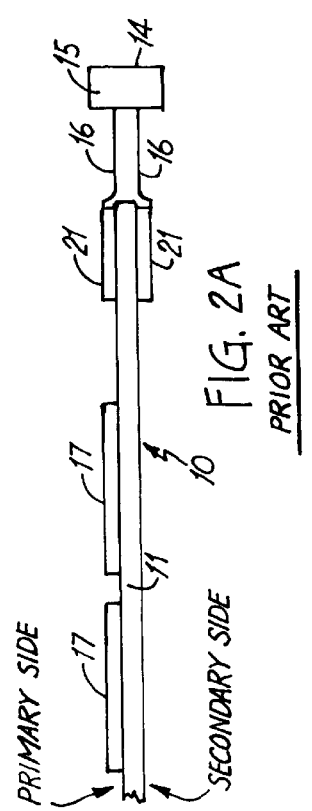
FIG. 2C is a prior art profile view showing a circuit card's connector pads with solder paste and previously reflowed, solid solder prior to mating with an edge connector.
Figure 2D:
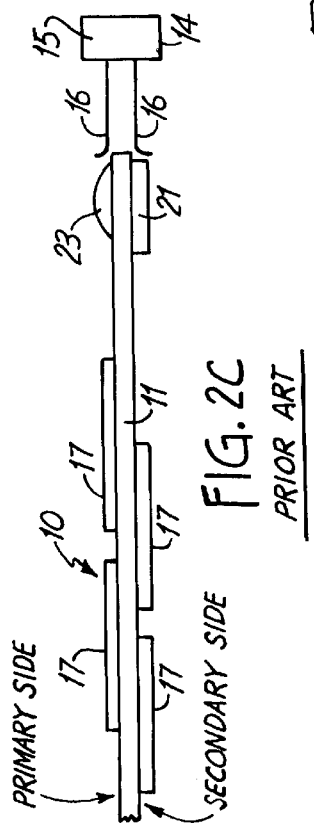
FIG. 2D is a prior art profile view of the circuit card of FIG. 2C after mating with the edge connector.
Figure 2E:
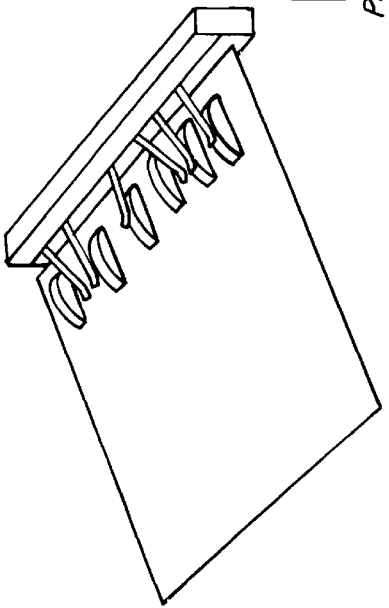
FIG. 2E is a prior art perspective view of the circuit card of FIG. 2D after mating with the edge connector.
Figure 3A:
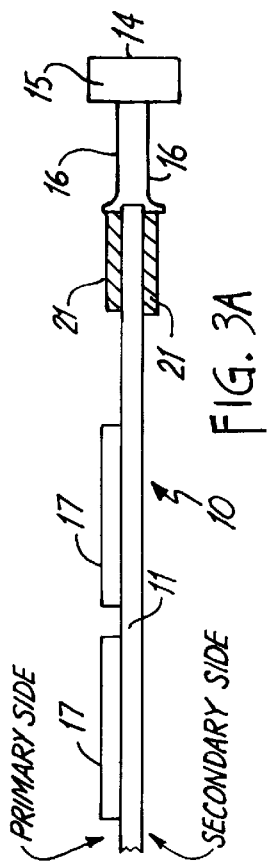
FIG. 3A is a profile view of an embodiment of a circuit card assembly of the present invention showing a circuit card's connector pads with solder paste prior to mating with an edge connector.
Figure 3B:
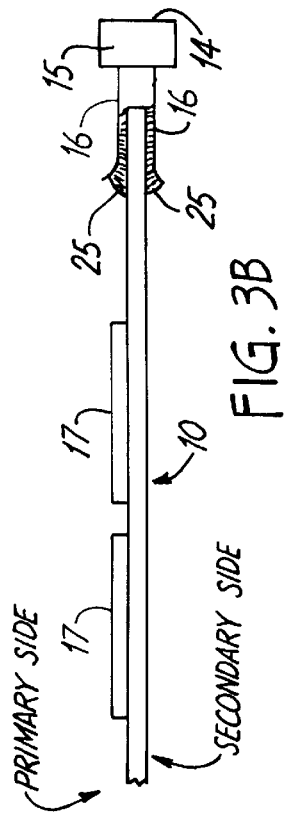
FIG. 3B is a profile view of the circuit card assembly of FIG. 3A with the edge connector partially mated with the circuit card.
Figure 3C:
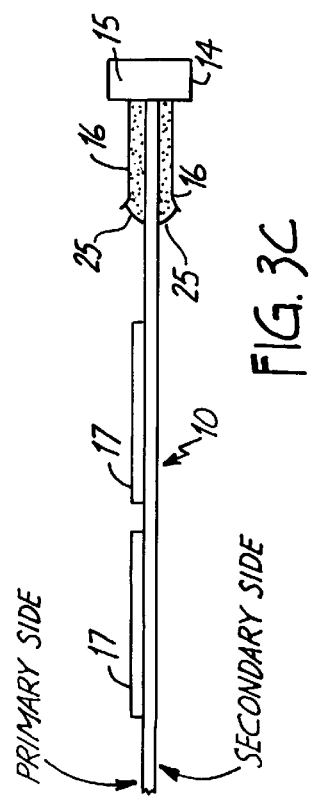
FIG. 3C is a profile view of the circuit card assembly of FIGS. 3A and 3B with the edge connector mated with the circuit card.

FIGS. 3A to 3C depict various stages of mating an edge connector 14 with a circuit card 11 pursuant to one embodiment of the present invention. In FIG. 3A, the nonvertically approaching leads 16 of connector 14 are proximate to their corresponding pads (not visible) while the nonliquidus solder, which is in the form of solder paste 21, is being heated and has not at least attained its liquidus phase temperature. As shown in FIGS. 3B and 3C, once the solder is sufficiently heated (i.e., into a liquidus phase) connector 14 is mated with circuit card 11. In turn, the nonvertically approaching leads 16 slide through the liquidus solder 25 as they are positioned onto their pads 13.

Alternatively, FIGS. 4A to 4C depict various stages of mating an edge connector 14 with a circuit card 11 pursuant to another embodiment of the present invention. In FIG. 4A, the nonvertically approaching leads 16 of connector 14 are proximate to their corresponding connector pads (not visible) while the nonliquidus solder, which is in the form of solid, previously melted solder 23 on the primary side and solder paste 21 on the secondary side, is being heated and has not at least attained its reflow temperature. As shown in FIGS. 4B and 4C, once the solder is in a liquidus phase, the connector 14 may be mated to the circuit card 11 with the nonvertically approaching leads 16 sliding through liquidus solder 27 (primary side) and 25 (secondary side) as they are positioned onto their corresponding pads 13. With the present invention, it can be seen that the lead displaces the liquidus solder allowing it to "wett" to the metallized surfaces of the pad and device. Liquidus solder will be repelled from the non-metallized surfaces of the circuit card 11 because of the solder mask; thus, the liquidus solder is constrained to the metallized pad surfaces. The liquidus solder will mix with the circuit card pad surface metal and lead surface metal to form a homogeneous metal joint providing both a mechanical and electrical connection between lead and pad surfaces.

"Nonliquidus solder" means any suitable solder that is in a nonliquidus phase. It could include but is not limited to previously melted solid solder and solder paste, which is a mixture of flux and solid solder granules. The solder may be any type of suitable solder including but not limited to 63/37 (63% tin, 37% lead) solder. The solder paste 21 may be any suitable solder paste (e.g., aqueous, no-clean) that operably conveys the selected solder.

In one embodiment, circuit card 11 is a conventional Personal Computer Memory Card international Association ("PCMCIA") printed circuit board, which comprises a laminate surface/solder mask, which is nonadhesive with respect to the selected solder (e.g., 63/37 solder) once it is melted. However, the solder is adhesive with respect to the nonvertically approaching leads 16 and their corresponding pads. As a result of these adhesive/nonadhesive relationships, the liquidus solder (25 or 27) concentrates on the pads and wetts the nonvertically approaching leads 16 in order to conductively and mechanically adhere them to the pads.

5.2 Reflow Heating

In order to melt nonliquidus solder for soldering nonvertically approaching leads to their corresponding pads, the solder, along with the pads, nonvertically approaching device, and circuit card, should be heated together to avoid temperature differences between solder and soldered surfaces in order to prevent heat from being drawn away from the solder while the leads are being positioned onto their corresponding pads. Thus, when soldering an edge connector 14 to a circuit card 11, the edge connector 14 and circuit card 11 (including the nonliquidus solder) should be heated together while melting the solder and mating the connector 14 to the circuit card 11.

The circuit card assembly 10 may be heated in any conventional oven that is capable of reflowing solder. Such an oven could include but is not limited to a convection oven, an infrared radiation oven, a gas (plasma) oven, or an oven that is a combination thereof. In one embodiment, the oven is a convection conveyor oven from Speedline Technologies/Electrovert, Inc. of Grand Prairie, Tex. or a convection oven from Conceptronic, Inc. of Portsmouth, N.H.

In one embodiment, the nonliquidus solder is heated to at least a "minimum mating temperature" to ensure that it is sufficiently liquidus for mating the connector 14 to the circuit card 11. The minimum mating temperature is the minimum temperature, as defined by design, for mating connector 14 with circuit card 11. The minimum mating temperature should at least be equal to the eutectic temperature of the selected solder. For example, with 63/37 solder, which has a eutectic temperature of 183° C., the minimum mating temperature would at least be 183° C. However, to ensure that the nonliquidus solder has sufficiently liquified before mating the connector 14 with the circuit card 11, a higher minimum mating temperature may be preferred. In addition, a higher minimum mating temperature results in the liquidus solder having a lower viscosity when receiving the nonvertically approaching leads 16. This enables the connector to be mated with the circuit card at a higher rate of acceleration. On the other hand, the minimum mating temperature should not exceed a safe maximum in order to avoid thermal degradation of the circuit card assembly 10. In one embodiment, the minimum mating temperature is selected to be about 10° C. above the eutectic temperature of the selected solder. Thus, with 63/37 solder, the minimum mating temperature would approximately be 193° C.

With these considerations in mind, the circuit card assembly 10 may be heated pursuant to conventional heating control methodologies. However, the heating rate(s) may be limited by such factors as the heating criteria of components and circuit card. For example, most manufactures recommend that the components' solder should not be heated at a rate that exceeds about 2.5° C./sec.

Once the solder has melted and connector 14 has been mated with circuit card 11, the circuit card assembly may be cooled according to conventional reflow soldering practices in order to solidify the resulting solder connections. For the most part, the rate at which the circuit card assembly is cooled will be limited by the cooling criteria of components or circuit card (e.g., PCB).

5.3 Mating Control

A mating control scheme is utilized to ensure that a nonvertically approaching device is mated with its soldering surface at a time when the solder is sufficiently liquified.

5.3.1 A First Embodiment

Figure 5A:
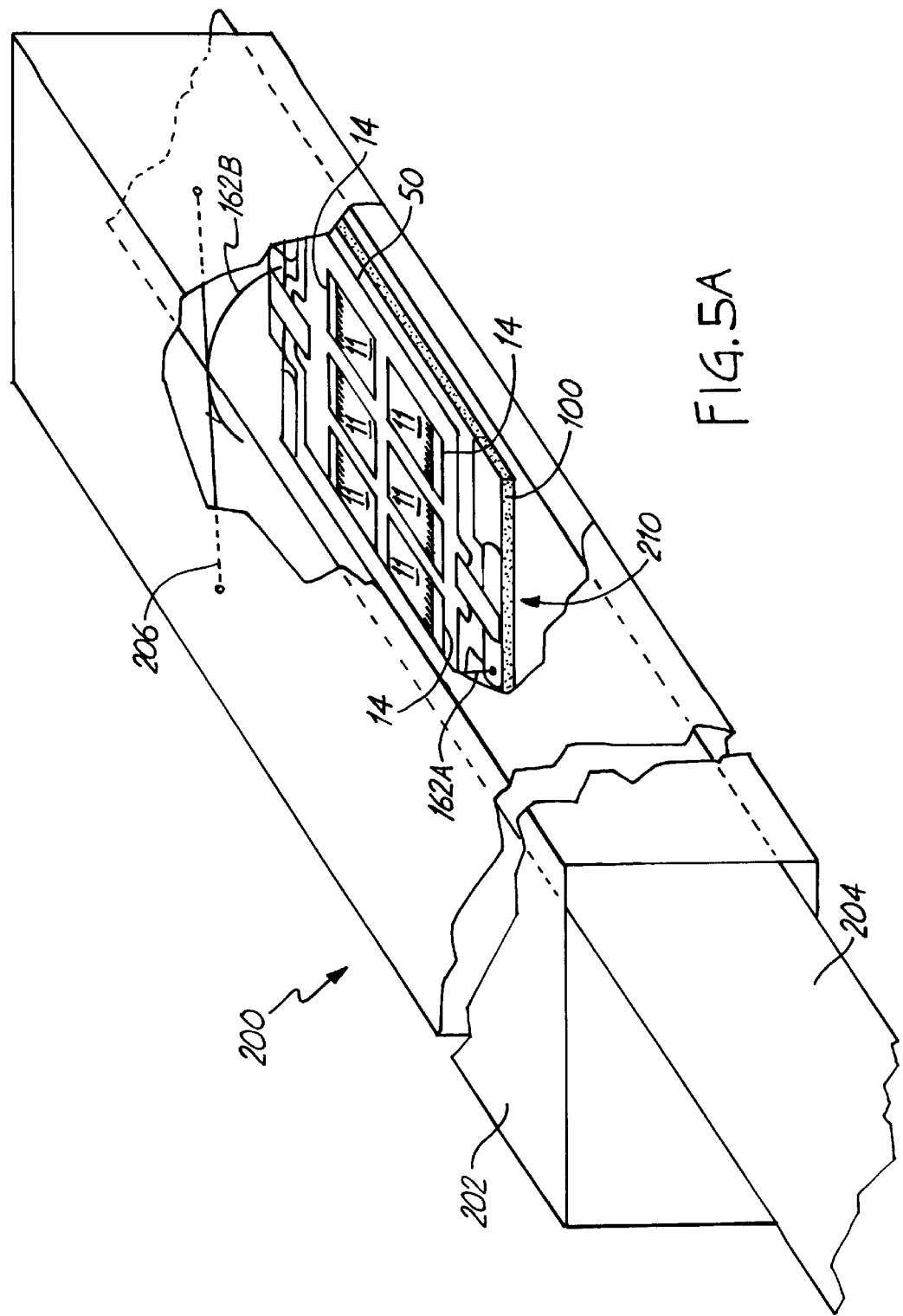
FIG. 5A is a perspective view of an embodiment of a system for reflow soldering an edge connector to a circuit card during the reflow process.
Figure 5B:
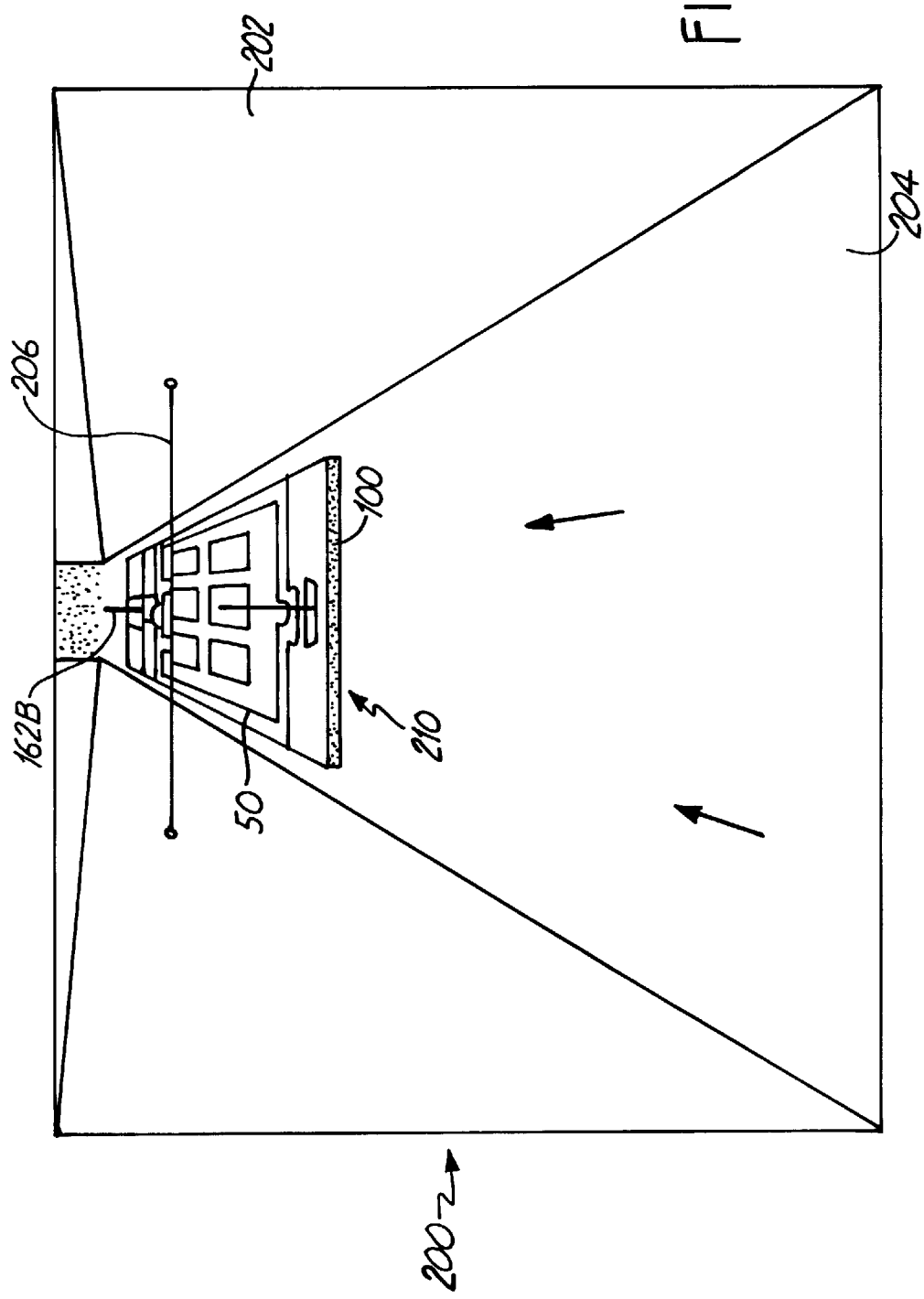
FIG. 5B is an end view of the system of FIG. 5B.

FIGS. 5A and 5B show one embodiment of a system 200 for reflowing connector(s) 14 to circuit card(s) 11 in a manner that is consistent with the present invention. System 200 includes conveyor oven 202 and mating pallet assembly 210. Mating pallet assembly 100 includes tray assembly 50 and mating pallet 100, which includes trigger switches 162A and 162B. Conveyor oven 202 has a conveyor belt 204 for transporting mating pallet assembly 100 through conveyor oven 202. Conveyor oven 202 further includes a trigger discharge mechanism 206 for initiating mating pallet 100 to mate the connectors 14 with circuit cards 11. As used hereinafter, a "mating pallet" is any apparatus or combination of apparatuses that is used to mate a nonvertically approaching device with the soldered surface(s) to which it is to be soldered. A "trigger discharge mechanism" is any mechanism that is used to initiate a mating pallet to mate the nonvertically approaching device with the soldering surface. For example, a trigger discharge mechanism could be an RF transmitter, a laser, heat activated material, electrical switch, or a mechanical lever. In the depicted embodiment, trigger discharge mechanism 206 is a trip wire that is transversely mounted within conveyor oven 202. Trigger discharge mechanism 206, as well as its position in the oven 202, are part of an overall open-loop control system for initiating mating when the solder is sufficiently liquidus.

In operation, as mating pallet assembly 210 moves past triggering discharge mechanism 206, trigger switches 162A and 162B, respectively, come into contact with and thus are triggered by trigger discharge mechanism 206. Trigger discharge mechanism 206 is mounted to the interior of oven 202 at a location where the solder temperature will be at least equal to the minimum mating temperature. Persons of ordinary skill in the art will recognize that the solder temperature can be accurately predicted as a function of the mating pallets assembly's traveled distance within conveyor oven 202. This value will depend, among other things, upon such factors as oven temperature(s) at various stages within the oven and conveyor belt speed.

FIGS. 6A to 6J show mating pallet assembly 210 including tray assembly 50 and mating pallet 100. Tray assembly 50 includes circuit card array 30, which includes circuit cards 11.

Figure 6A:
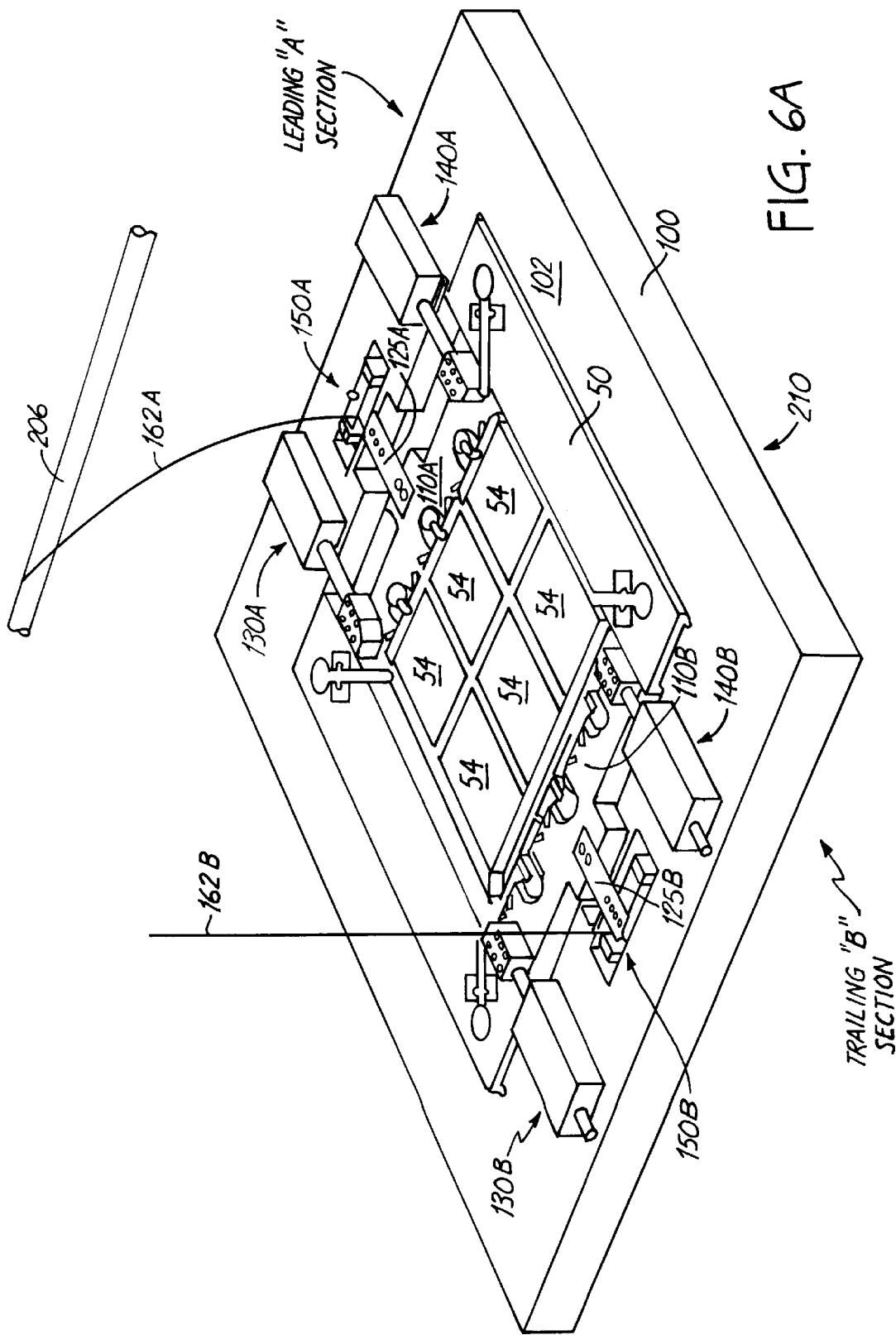
FIG. 6A is a perspective view of one embodiment of a mating pallet of the present invention.
Figure 6B:
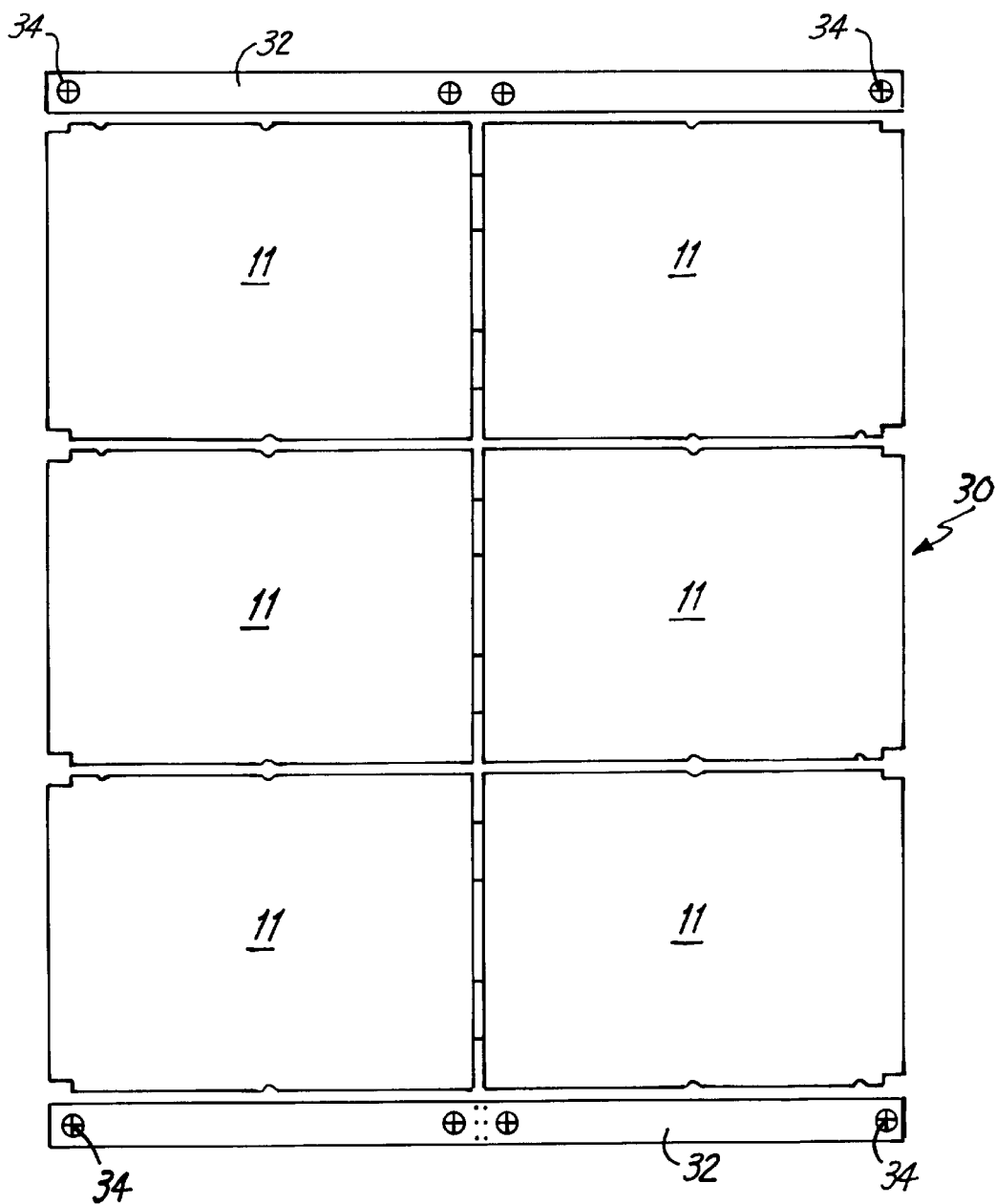
FIG. 6B shows one embodiment of a circuit card array.

With reference to FIG. 6B, circuit card array 30 includes frame strips 32 for framing the two three-card rows of circuit cards 11. The frame strips 32 assist in removably securing circuit cards 11 within tray assembly 50. For this purpose, they include retention holes 34.

5.3.1.1 Tray Assembly

Figure 6D:
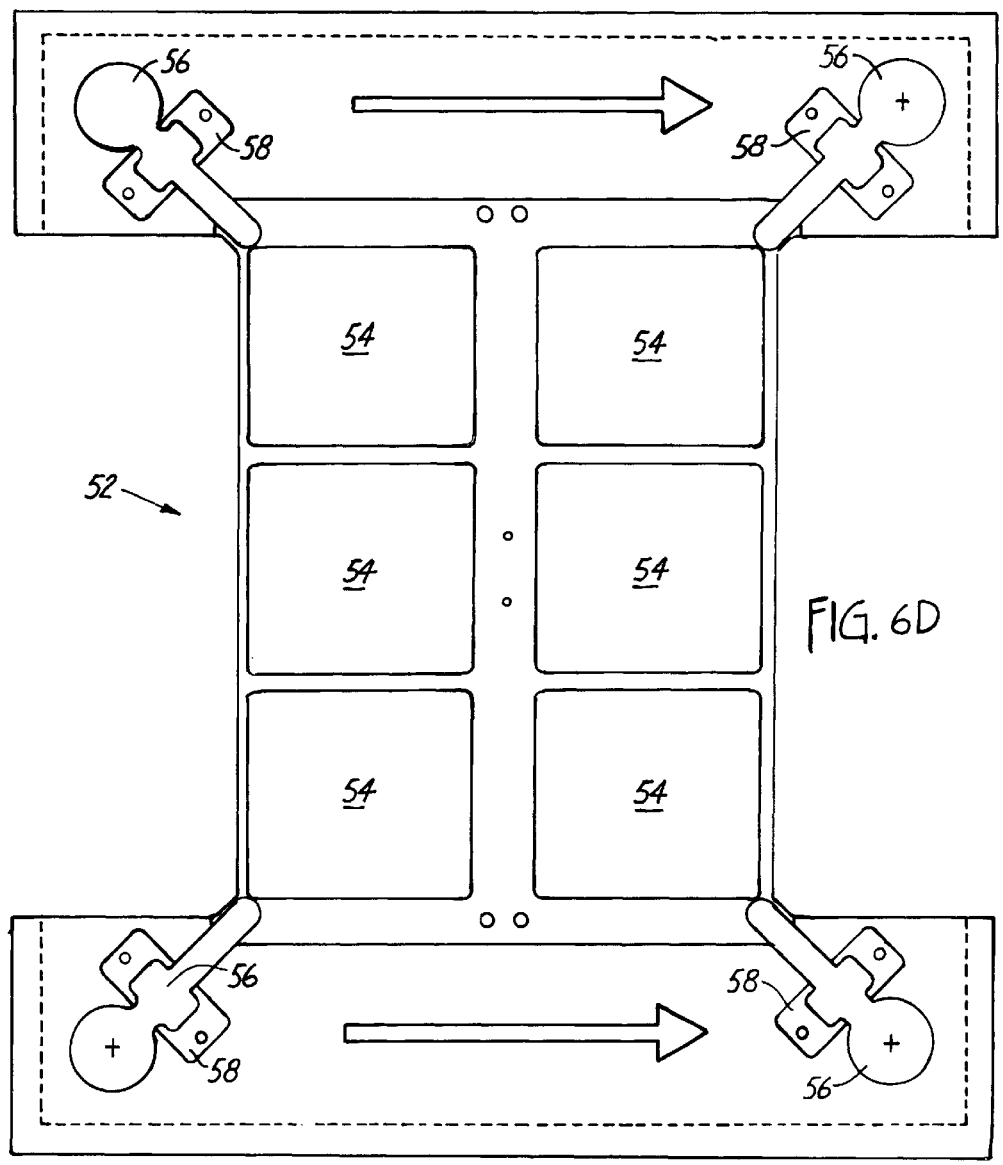
FIG. 6D depicts a top view of a tray housing for the tray assembly depicted in FIG. 6C.
Figure 6F:
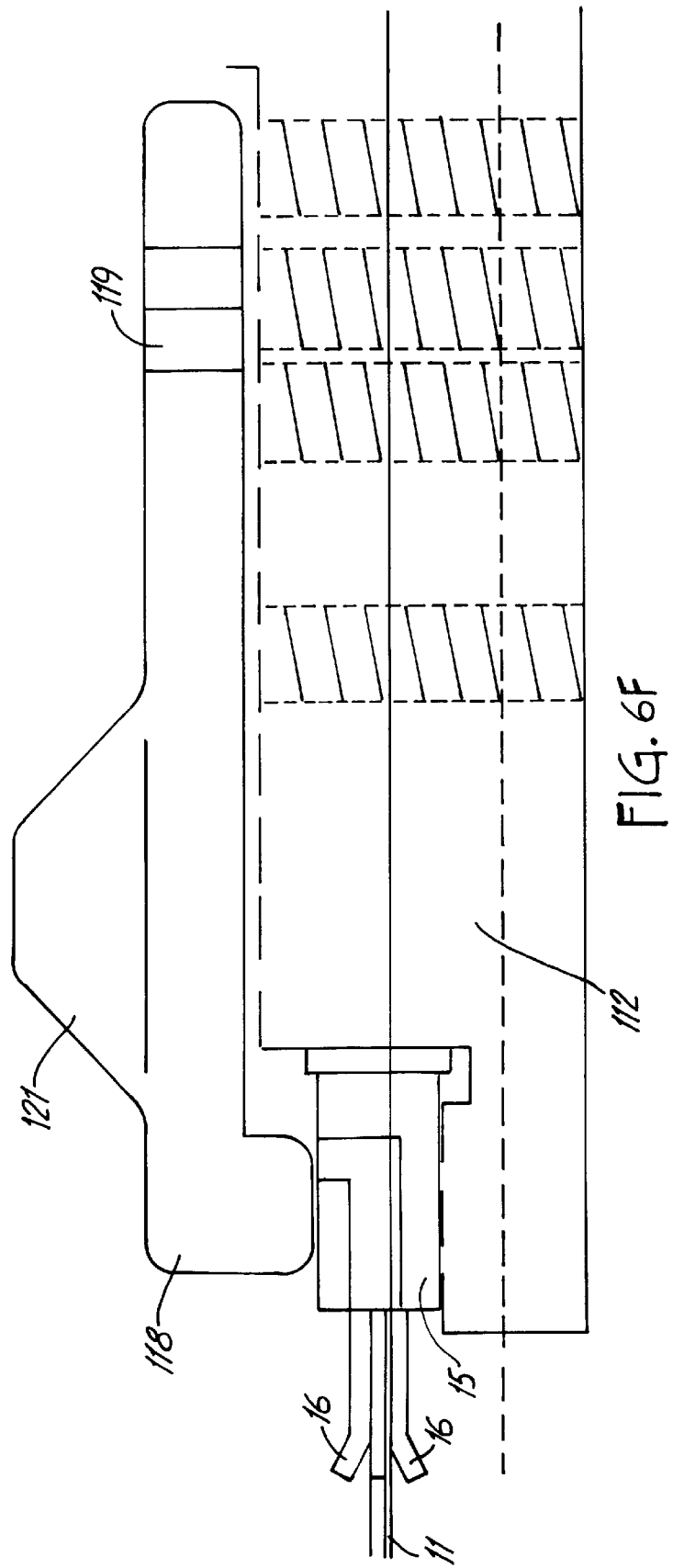
FIG. 6F shows a side view of a hold-down with a connector from the mating pallet of FIGS. 6A and 6C.
Figure 6J:
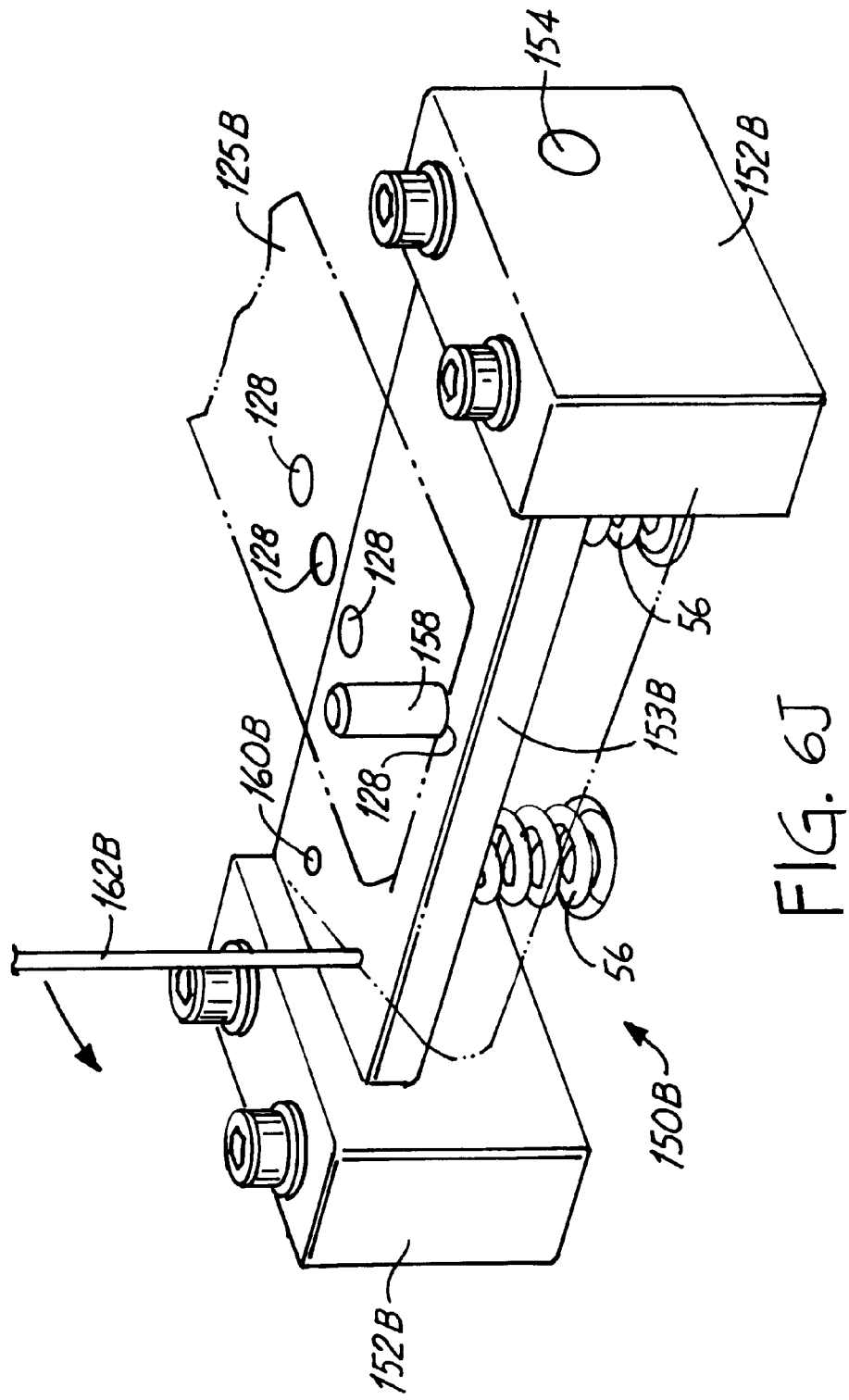
FIG. 6J is a perspective view of a trigger assembly from the mating pallet of FIGS. 6A and 6C.

Tray assembly 50, which removably fits into mating pallet 100, includes tray housing 52 and slide hook assemblies 60, which secure circuit card array 30 at each of its four corners through retention holes 34. Tray housing 52 may be machined from a unitary piece of suitable material such as Delmat™ fiberglass. As shown in FIG. 6D, tray housing 52 includes card clearance recesses 54, slide hook cavities 56, and cover plate recesses 58. Card clearance recesses 54 provide clearance for components, which may be mounted to the undersides of circuit cards 11. Slide hook cavities 56 and cover plate recesses 58 house slide hook assemblies 60 for retaining circuit card array 30.

Each slide hook assembly 60 includes a slide hook 62, hook springs 64, and a cover plate 66. Each slide hook 62 is slidably housed within a slide hook cavity 56. Each slide hook 62 also has an upward protruding hook peg 63 at the end that is proximate to a corner of the circuit card array 30, where it may be inserted and withdrawn from a retention hole 34. Hook springs 64 (which function as compression springs in the depicted embodiment) are operably mounted within each slide hook cavity 56 on opposite sides of each slide hook 62. Hook springs 64 nominally exert force onto each slide hook 62 away from the circuit card array 30. With each slide hook assembly 60, a cover plate 66 is mounted across and atop its slide hook 62 and hook springs 64 to secure the slide hook 62 and hook springs 64 in place within a slide hook cavity 56. The cover plates 66 have tabs (not referenced), which are mounted within cover plate recesses 58, which make the tabs flush with the surface of tray housing 52.

In operation, pressure may be applied from within a slide hook cavity 56 onto a slide hook 62 in the direction of the circuit card array 30 in order to mount or release a retention hole 34 to/from a hook peg 63 of a slide hook 62. Conversely, when the circuit card array 30 is mounted and the slide hooks are released, the circuit card array 30 is secured with tension drawn on each of its corners away from its center. Tension is applied upon the four corners of the circuit card array 30 to take up the expansion of the circuit card array 30 as it is heated in order to maintain its flat position onto the tray assembly 50. Without this tension, the circuit cards 11 may "bow" as they expand during heating.

5.3.1.2 Mating pallet

In the depicted embodiment of FIGS. 5A and 5B, mating pallet 100 transports tray assembly 50 (including connectors 14 and circuit cards 11) through conveyor oven 202. In response to passing under triggering discharge mechanism 206, which corresponds to a place in conveyor oven 206 where the solder will be liquidus, mating pallet 100 mates connectors 14 with circuit cards 11.

Mating pallet 100 includes pallet housing 102, a leading "A" section and a trailing "B" section, which is substantially symmetrical with the leading "A" section, as shown in FIG. 6C. The leading "A" section comprises holder assembly 110A, slide shaft assemblies 130A, 140A, and trigger assembly 150A. Similarly, the trailing "B" section comprises holder assembly 110B, slide shaft assemblies 130B, 140B, and trigger assembly 150B. With reference to FIG. 6E, pallet housing 102 has connector/tray recess area 103 and trigger block cavities 108A, 108B. The connector/tray recess area 103 includes a tray assembly region 105 for the tray assembly 50, a holder region 107A for holder assembly 110A, and a holder region 107B for holder assembly 110B. (In the interest of brevity, discussion will be limited to the leading "A" section keeping in mind that the trailing "B" section is structured and operates in an equivalent manner; however, the "B" section will be addressed when necessary to discuss any material differences.)

With reference to FIGS. 6A, 6C, and 6E, holder assembly 110A is supported by and slidably mounted to slide shaft assembles 130A and 140A, which are anchored to the pallet housing 102 on opposite sides of trigger assembly 150A. It can be seen from FIG. 6C that the outer contour of the right side of holder assembly 110A conforms to the contour of the right side of the holder region 107A. In addition, holder region 107A is large enough to enable holder assembly 110A to linearly travel toward tray array 50 (when triggered for mating) and away from tray assembly 50 (when loaded and set). For friction reduction, clearance exists between the underside of the holder assembly 110A and the surface of the holder region 107A. Accordingly, with this depicted embodiment, holder assembly 110A is completely supported by slide shaft assemblies 130A and 140A.

Trigger assembly 150A is mounted within trigger assembly cavity 108A. The trigger assembly 150A is in trigger communication with holder assembly 110A. That is, trigger assembly 150A releases holder assembly 110A when mating is to occur. In one embodiment, trigger assembly 150A retains holder assembly 110A when it is loaded in a pre-mating "set" position and releases it when mating is to occur (e.g., when discharged by trigger discharge mechanism 206).

5.3.1.2.1 Holder Assembly

A "holder assembly" may be any apparatus that holds a connector(s) (or any other nonvertically approaching device) in place during reflow heating and mates the connector(s) with a corresponding circuit card(s) in response to being triggered. With reference to FIGS. 6A, 6C, and 6F–6I, holder assembly 110A includes holder body 112A, three hold-downs 118, and retention tab 125. Holder body 112A, which is mounted to slide shaft assemblies 130A and 140A, includes three connector cavities 114 and three hold-down cavities 116. Connector cavities 114 hold connectors 14 with their nonvertically approaching leads 16 positioned for mating. Each hold-down 118 is pivotally mounted within a hold-down cavity 116 with a pivot pin 119. Each hold-down 118 has a handle 121, which enables an operator to easily rotate the hold-down onto a connector 14 in order to secure the connector 14 into its connector cavity 114.

The retention tab 125A is used to retain holder assembly 110A in a set position. With adjustment screws 127, retention tab 125A is adjustably fastened to holder 112A through an adjustment slot 126, which is located at one end of retention tab 125A. At its other end, retention tab 125A includes retention holes 128. A selected one of the retention holes 128 is used to retain the holder assembly 110A when it is loaded and set for mating.

5.3.1.2.2 Slide Shaft Assemblies

Slide shaft assembly 130A comprises spring block 132, slide shaft 134, spring 136, adjustment collar 137, and holder block 138. Spring block 132 further includes bearing cylinder 133 and spring cavity 135. Likewise, slide shaft assembly 140A comprises spring block 142, slide shaft 144, spring 146, adjustment collar 147, and holder block 148. Spring block 142 further includes bearing cylinder 143 and spring cavity 145.

As shown in FIG. 6C, spring block 132 is rigidly mounted to the pallet housing 102. Bearing cylinder 133 slidably houses and guides slide shaft 134. Slide shaft 134 is inserted through spring 136, which is contained within spring cavity 135. Adjustment collar 137 is adjustably mounted around slide shaft 134 between spring 136 and the end of spring cavity 135 that is nearest holder assembly 110A. Adjustment collar 137, (which may be a nut that operably rotates about slide shaft 134 within spring cavity 135), adjustably controls the spring tension exerted upon slide shaft 134.

Holder block 138 fixedly couples slide shaft 134 to holder body 112A. The end of slide shaft 134 not housed within spring block 132 is inserted and fixed within holder block 138, which is rigidly mounted to the surface of holder body 112A in alignment with spring block 132.

Slide shaft assembly 140A is constructed and mounts to the pallet housing 102 and holder assembly 110A in the same fashion as slide shaft assembly 130A, except that spring shaft assemblies 130A and 140A are mounted to pallet housing 102 on opposite sides of trigger assembly 150A. When properly adjusted with adjustment collars 137 and 147, slide shaft assemblies 130A, 140A enable holder assembly 110A to slide with desirable force into tray assembly 50 and mate connectors 14 with circuit cards 11. Springs 136, 146 exert forces onto holder assembly 110A through adjustment collars 137, 147, which move holder assembly 110A into the mating position when retention tab 125A is released by trigger assembly 150A.

5.3.1.2.3 Trigger Assembly

A trigger assembly is any apparatus that triggers (or initiates) a holder assembly to mate a connector (or any other device) with a soldering surface when the reflow solder is sufficiently liquidus. Trigger assembly 150A includes trigger blocks 152A, trigger flap 153A, axle 154, trigger springs 156, and trigger switch 162A. Spaced apart trigger blocks 152A are rigidly mounted to pallet housing 102 within trigger assembly cavity 108A. In turn, trigger flap 153A is rotatably mounted about axle 154, which is mounted between trigger blocks 152A. Exerting an upward force onto trigger flap 153A, trigger springs 156 are vertically mounted within and between housing receptacles 109 of pallet housing 102 and the underside of trigger flap 153A. Trigger flap 153A includes trigger switch holes 160A. Trigger switch 162A (which may in this embodiment be a sufficiently rigid yet flexible wire) is vertically mounted within a selected one of trigger switch holes 160A. The various trigger switch holes 160A provide leverage variations exerted by trigger switch 162A onto trigger flap 153A. Trigger flap 153A also includes retention peg 158, which inserts into the selected one of retention holes 128 of the retention tab 125A (as trigger flap 153A is rotated upward) when the holder assembly 110A is set for mating.

5.3.1.3 Operation

Prior to reflow, holder assemblies 110A, 110B are loaded with connectors 14 and set for mating. With tray assembly 50 inserted in place within the connector/tray recess 103, holder assemblies 110A, 110B are each drawn away from tray assembly 50 toward trigger assemblies 150A, 150B, respectively. Connectors 14 are loaded into connector cavities 114, and the connector holder assemblies 110A, 110B are set for mating. In setting holder assemblies 110A, 110B, an operator inserts the retention peg 158 from each of the trigger flaps 153A, 153B into a selected one retention hole 128 of retention tabs 125A, 125B, respectively. This retention is maintained with upward forces exerted from trigger springs 156 until trigger switch 162A is rotated. In one embodiment, holder assemblies 110A, 110B are adjustably set so that nonvertically approaching leads 16 straddle the remote edges of circuit cards 11 without significantly engaging the connector pads 113. In this manner, the nonvertically approaching leads 16 are less likely to "jam" as they are thrust onto circuit cards 11 by spring-loaded slide shafts 134, 144. To attain a desirable setting, a retention hole 128 is initially selected as a course adjustment. The holder bodies 112A, 112B can then be finely adjusted with adjustment screws 127.

With holder assemblies 110A, 110B loaded and set for mating, mating pallet assembly 210 is ready for reflow through conveyor oven 202. Trigger discharge mechanism 206 is mounted within conveyor oven 202 at a location that corresponds to the solder temperature of circuit cards 11 being at their preselected minimum mating temperature (e.g., 193° C. for 63/37 solder). Persons of ordinary skill in the art will recognize that this location depends, among other things, on the heating characteristics of conveyor oven 202, the velocity of belt 204, and the thermal conductive properties of mating pallet assembly 210 including mating pallet 100, tray assembly 50, circuit cards 11, and connectors 14. The loaded mating pallet assembly 210 is placed onto belt 204 aligned so that the leading "A" section enters the oven prior to the trailing "B" section. As the mating pallet assembly 210 progresses through the oven, the nonliquidus solder of circuit cards 11 (including the nonliquidus solder on its connector pads) increases in temperature. By the time mating pallet assembly 210 reaches trigger discharge mechanism 206, the nonliquidus solder has at least attained the minimum mating temperature and thus is in a liquidus state. When striking trigger discharge mechanism 206, trigger switch 162A (which initially encounters trigger discharge mechanism 206) begins to rotate back toward the trailing B section. As it rotates, trigger switch 162A causes trigger flap 153A to rotate downward (against the forces exerted by trigger springs 156) into trigger assembly cavity 108A, which causes retention peg 158 to drop out of retention tab 125A. This releases holder assembly 110A, and spring shaft assemblies 130A, 140A force the nonvertically approaching leads 16 (from connectors 14 of holder body 112A) onto their corresponding pads and into the liquidus solder. Thereafter, trigger switch 162B engages trigger discharge mechanism 206, which causes connectors 14 from holder body 112B to mate with their corresponding circuit cards 11 in an equivalent manner. After mating, the mating pallet assembly 210 progresses through conveyor oven 202 and is cooled to room temperature, which causes the solder to solidify, thereby mounting connectors 14 to the circuit cards 11.

5.3.2 Other Mating Control Approaches

Other mating control approaches may be used to ensure that mating occurs while the solder is at least at the selected minimum mating temperature. Instead of implementing a trigger assembly with a trigger switch that is responsive to a trip line, (or any other trigger discharge mechanism located at a certain position corresponding to acceptable solder temperature), a different type of triggering could be used.

For example, a temperature transducer could be incorporated into the trigger assembly. In one embodiment, a thermocouple could be incorporated to mechanically or electronically (e.g., closing a switch) initiate mating. In another embodiment, a temperature sensor such as a temperature probe or thermistor could be used in connection with an electronically actuated trigger assembly.

In addition, a timing trigger could be used. Depending upon the heating characteristics of the reflow oven and circuit card assembly, a timing trigger could be set to initiate mating after a preselected time that corresponds to the solder having attained the minimum mating temperature.

With both temperature and timing trigger assemblies, any conventional oven (with or without a conveyor system) that is suitable for reflowing solder may be implemented.

5.4 Remarks

It will be seen by those skilled in the art that various changes may be made without departing from the spirit and scope of the invention.

For example, while the description has primarily discussed mating an edge connector to a circuit card, the invention encompasses soldering any nonvertically approaching device to a soldering surface with reflow soldering. In addition, the invention encompasses situations with a device soldered to a circuit card regardless of whether the circuit card has components on none, one or both sides. Furthermore, the nonliquidus solder may be previously reflowed solder, solid solder housed in solder paste, a combination thereof, or any other nonliquidus solder that yields similar problems with traditional reflow methods. The invention also covers mating any leaded device (including vertically approaching leaded devices) in an oven with liquidus solder that results from previously reflowed, nonliquidus solder.

Accordingly, the invention is not limited to what is shown in the drawings and described in the specification but only as indicated in the appended claims.

What is claimed is:

1. A mating pallet for soldering a device having nonvertically approaching leads to a circuit card, the circuit card having nonliquidus solder that is to be heated and reflowed into liquidus solder in order to solder the device to the circuit card, the mating pallet comprising:
   (a) a holder assembly for holding the device in a reflow oven while the solder is heated for reflow; and
   (b) a trigger assembly in communication with the holder assembly to trigger the holder assembly to mate the device with the circuit card while the solder is liquidus.

2. The mating pallet of claim 1, wherein the trigger assembly is in mechanical communication with the holder assembly.

3. The mating pallet of claim 2 further comprising a pallet housing, wherein the holder assembly is slidably mounted to the pallet housing to slide toward the circuit card when mating the connector with the circuit card.

4. The mating pallet of claim 3 further comprising a slide shaft assembly mounted between the pallet housing, and mating pallet assembly to slidably mount the holder assembly to the pallet housing, the slide shaft assembly including a spring that exerts a nominal force on the holder assembly in the direction of the circuit card.

5. The mating pallet of claim 4, wherein the trigger assembly is mounted to the pallet housing to retain the holder assembly when it is in a set position, wherein the trigger assembly releases the holder assembly in triggering it to mate the connector with the circuit card.

6. The mating pallet of claim 5, wherein the oven is a conveyor oven and the trigger assembly includes a trigger switch that causes the trigger assembly to release the holder assembly when the trigger switch arrives at a preselected location in the conveyor oven.

7. The mating pallet of claim 6, wherein the trigger switch causes the trigger assembly to release the holder assembly in response to encountering a trip line that is mounted within the conveyor oven.

8. The mating pallet of claim 1, wherein the trigger assembly includes a timer to initiate the trigger assembly to trigger the holder assembly in response to sensing the expiration of a preselected amount of time that corresponds to the solder being sufficiently heated into the liquidus phase.

9. The mating pallet of claim 1, wherein the trigger assembly includes a temperature transducer in thermal connection with the solder for sensing the temperature of the solder, wherein the trigger assembly triggers the holder assembly in response to the temperature transducer sensing that the solder temperature is at least equal to a selected mating temperature.

10. The mating pallet of claim 1, wherein the device is a connector.

11. An apparatus for mounting a device having nonvertically approaching leads to a circuit card that includes solder to be reflowed for soldering the nonvertically approaching leads to pads on the circuit card, the apparatus comprising:
   (a) a mating pallet having (1) a device holder assembly to hold the device and mate it with the circuit card and (2) a trigger assembly in trigger communication with the holder assembly; and
   (b) an oven for receiving the mating pallet and reflowing the solder, wherein the trigger assembly triggers the holder assembly to mate the device with the circuit card while the solder is liquidus.

12. The apparatus of claim 11, wherein the mating pallet includes a removable tray assembly that removably retains the circuit card.

13. The apparatus of claim 11, wherein the trigger assembly includes a timer for initiating the trigger assembly to trigger the holder assembly to mate the device with the circuit card after the mating pallet has been in the oven for an amount of time that is sufficient for the nonliquidus solder to become liquidus.

14. The apparatus of claim 11, wherein the trigger assembly includes a temperature sensor for initiating the trigger assembly to trigger the holder assembly to mate the device with the circuit card while the solder temperature is at least equal to a selected mating temperature.

15. The mating pallet of claim 14, wherein the selected mating temperature is at least ten celsius degrees above the eutectic temperature of the solder.

16. The mating pallet of claim 11, wherein the oven is a conveyor oven and the trigger assembly includes a trigger switch that initiates the trigger assembly to trigger the holder assembly to mate the device with the circuit card in response to the mating pallet arriving at a selected location in the conveyor oven.

17. The apparatus of claim 16, wherein the conveyor oven includes a trip line mounted within the oven proximate to the selected location to initiate the trigger assembly to trigger the device holder assembly to mate the device with the circuit card when the trigger switch encounters the trip line.

18. The apparatus of claim 11, wherein the device is a connector.

* * * * *